(12) United States Patent
Ren et al.

(10) Patent No.: US 9,299,577 B2
(45) Date of Patent: Mar. 29, 2016

(54) METHODS FOR ETCHING A DIELECTRIC BARRIER LAYER IN A DUAL DAMASCENE STRUCTURE

(71) Applicant: Applied Materials, Inc., Santa Clara, CA (US)

(72) Inventors: He Ren, San Jose, CA (US); Chia-Ling Kao, San Jose, CA (US); Sean Kang, San Ramon, CA (US); Jeremiah T P Pender, San Jose, CA (US); Srinivas D. Nemani, Sunnyvale, CA (US); Mehul B. Naik, San Jose, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 101 days.

(21) Appl. No.: 14/540,577

(22) Filed: Nov. 13, 2014

(65) Prior Publication Data

US 2015/0214101 A1   Jul. 30, 2015

Related U.S. Application Data

(60) Provisional application No. 61/931,445, filed on Jan. 24, 2014.

(51) Int. Cl.
*H01L 21/308* (2006.01)
*H01L 21/768* (2006.01)
*H01L 21/311* (2006.01)
*H01L 21/02* (2006.01)
*H01L 21/033* (2006.01)
*H01L 21/3065* (2006.01)
*H01L 21/306* (2006.01)

(52) U.S. Cl.
CPC .......... *H01L 21/308* (2013.01); *H01L 21/0234* (2013.01); *H01L 21/02063* (2013.01); *H01L 21/0332* (2013.01); *H01L 21/3065* (2013.01); *H01L 21/30604* (2013.01); *H01L 21/31116* (2013.01); *H01L 21/31138* (2013.01); *H01L 21/31144* (2013.01); *H01L 21/76807* (2013.01)

(58) Field of Classification Search
CPC ................... H01L 21/31116; H01L 21/31138; H01L 21/31144; H01L 21/76807; H01L 21/0234; H01L 21/30604
See application file for complete search history.

(56) References Cited

U.S. PATENT DOCUMENTS

2003/0003754 A1* 1/2003 Yokoi et al. .................... 438/704
2005/0026420 A1* 2/2005 Han et al. ....................... 438/622

* cited by examiner

*Primary Examiner* — Jiong-Ping Lu
(74) *Attorney, Agent, or Firm* — Patterson & Sheridan, LLP

(57) ABSTRACT

Methods for eliminating early exposure of a conductive layer in a dual damascene structure and for etching a dielectric barrier layer in the dual damascene structure are provided. In one embodiment, a method for etching a dielectric barrier layer disposed on a substrate includes patterning a substrate having a dielectric bulk insulating layer disposed on a dielectric barrier layer using a hardmask layer disposed on the dielectric bulk insulating layer as an etching mask, exposing a portion of the dielectric barrier layer after removing the dielectric bulk insulating layer uncovered by the dielectric bulk insulating layer, removing the hardmask layer from the substrate, and subsequently etching the dielectric barrier layer exposed by the dielectric bulk insulating layer.

18 Claims, 5 Drawing Sheets

METHODS FOR ETCHING A DIELECTRIC BARRIER LAYER IN A DUAL DAMASCENE STRUCTURE

CROSS-REFERENCE TO RELATED APPLICATIONS

This application claims benefit of U.S. Provisional Application Ser. No. 61/931,445 filed Jan. 24, 2014, which is incorporated by reference in their entirety.

BACKGROUND OF THE INVENTION

1. Field of the Invention

Embodiments of the present invention generally relate to methods for forming semiconductor devices. More particularly, embodiments of the present invention generally relate to methods for etching a dielectric barrier layer without damaging underlying conductive structures for manufacturing semiconductor devices.

2. Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and quality of individual substrates and die.

A patterned mask, such as a photoresist layer or a hard mask layer, is commonly used to etch structures, such as gate structures, shallow trench isolation (STI), bit lines and the like, or back end dual damascene structures on a substrate. The patterned mask is conventionally fabricated by using a lithographic process to optically transfer a pattern having the desired critical dimensions to a layer of photoresist. The photoresist layer is then developed to remove undesired portions of the photoresist, thereby creating openings in the remaining photoresist.

As the dimensions of the integrated circuit components are reduced (e.g., to sub-micron dimensions), the materials used to fabricate such components must be carefully selected in order to obtain satisfactory levels of electrical performance. For example, when the distance between adjacent metal interconnects and/or the thickness of the dielectric bulk insulating material that isolates interconnects have sub-micron dimensions, the potential for capacitive coupling between the metal interconnects is high. Capacitive coupling between adjacent metal interconnects may cause cross talk and/or resistance-capacitance (RC) delay which degrades the overall performance of the integrated circuit and may render the circuit inoperable. In order to minimize capacitive coupling between adjacent metal interconnects, low dielectric constant bulk insulating materials (e.g., dielectric constants less than about 4.0) are needed. Examples of low dielectric constant bulk insulating materials include silicon dioxide ($SiO_2$), silicate glass, fluorosilicate glass (FSG), and carbon doped silicon oxide (SiOC), among others.

In addition, a dielectric barrier layer is often utilized to separate the metal interconnects from the dielectric bulk insulating materials. The dielectric barrier layer minimizes the diffusion of the metal from the interconnect material into the dielectric bulk insulating material. Diffusion of the metal into the dielectric bulk insulating material is undesirable because such diffusion can affect the electrical performance of the integrated circuit, or render the circuit inoperative. The dielectric barrier layer needs to have a low dielectric constant in order to maintain the low-k characteristic of the dielectric stack between conductive lines. The dielectric barrier layer also acts as an etch-stop layer for a dielectric bulk insulating layer etching process, so that the underlying metal will not be exposed to the etching environment. The dielectric barrier layer typically has a dielectric constant of about 5.5 or less. Examples of dielectric barrier layer are materials silicon carbide (SiC) and nitrogen containing silicon carbide (SiCN), among others.

After the dielectric barrier layer etching process, the underlying upper surface of the conductive layer is exposed to air. However, early exposure of the underlying conductive layer may result in the conductive layer being subjected to oxidizing conditions during a subsequent etching process or excess exposure to the ambient environment, which may adversely accumulate native oxides or contaminants on the metal surface prior to a subsequent metallization process. Excess native oxide accumulation or contaminants may adversely affect the nucleation capability of the metal elements to adhere to the substrate surface during the metallization process. Furthermore, poor adhesion at the interface may also result in undesired high contact resistance, thereby resulting in undesirably poor electrical properties of the device. In addition, poor nucleation of the metal elements in the back end interconnection may impact not only the electrical performance of the devices, but also on the integration of the conductive contact material subsequently formed thereon.

Thus, there is a need for improved methods to eliminate early exposure of a conductive layer in a dual damascene structure and to etch a dielectric barrier layer with good interface quality control with minimum substrate oxidation and contamination.

SUMMARY

Methods for eliminating early exposure of a conductive layer in a dual damascene structure and for etching a dielectric barrier layer in the dual damascene structure are provided. In one embodiment, a method for etching a dielectric barrier layer disposed on a substrate includes patterning a substrate having a dielectric bulk insulating layer disposed on a dielectric barrier layer using a hardmask layer disposed on the dielectric bulk insulating layer as an etching mask, exposing a portion of the dielectric barrier layer after removing the dielectric bulk insulating layer uncovered by the dielectric bulk insulating layer, removing the hardmask layer from the substrate, and subsequently etching the dielectric barrier layer exposed by the dielectric bulk insulating layer.

In another embodiment, a method for etching a dielectric barrier layer disposed on a substrate includes patterning a substrate having a dielectric bulk insulating layer disposed on a dielectric barrier layer using a hardmask layer disposed on the dielectric bulk insulating layer as an etching mask, exposing a portion of the dielectric barrier layer after removing the dielectric bulk insulating layer uncovered by the dielectric bulk insulating layer, removing the hardmask layer from the substrate, subsequently etching the dielectric barrier layer exposed by the dielectric bulk insulating layer by generating a plasma in an etching gas mixture to etch the dielectric barrier layer disposed on the substrate, wherein the etching gas mixture includes an ammonium gas and a nitrogen trifluoride, and plasma annealing the substrate to remove the dielectric barrier layer from the substrate.

In yet another embodiment, a method for etching a dielectric barrier layer disposed on a substrate includes patterning a substrate having a dielectric bulk insulating layer disposed on a dielectric barrier layer using a hardmask layer disposed on the dielectric bulk insulating layer as an etching mask, exposing a portion of the dielectric barrier layer after removing the dielectric bulk insulating layer uncovered by the dielectric bulk insulating layer, removing the hardmask layer from the substrate, and subsequently etching the dielectric barrier layer exposed by the dielectric bulk insulating layer, the etching of the dielectric barrier layer further comprises performing a treatment process on the dielectric barrier layer, performing a remote plasma process in an etching gas mixture supplied into the etching processing chamber to etch the treated dielectric barrier layer disposed on the substrate, and performing a plasma annealing process to anneal the dielectric barrier layer to remove the dielectric barrier layer from the substrate.

BRIEF DESCRIPTION OF THE DRAWINGS

So that the manner in which the above recited features of the present invention can be understood in detail, a more particular description of the invention, briefly summarized above, can be had by reference to embodiments, some of which are illustrated in the appended drawings. It is to be noted, however, that the appended drawings illustrate only typical embodiments of this invention and are therefore not to be considered limiting of its scope, for the invention can admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Methods for forming a dual damascene structure without early exposure to an underlying conductive layer formed in the dual damascene structure and for etching a dielectric barrier layer in the dual damascene structure are disclosed herein which provide an etching process with high etching selectivity and interface high quality after the dual damascene manufacturing process. In one embodiment, the dielectric barrier layer etching process includes a cyclic etching process to repetitively and incrementally etch the dielectric barrier layer until an underlying conductive layer is exposed. Furthermore, the sequence for etching film materials formed in the dual damascene structure is also arranged in a manner (known as "Barrier Open Last" process) to eliminate exposure time of the conductive layers after the dielectric barrier layer etching process. By utilizing an etching process with high etching selectivity along with the "Barrier Open Last" process sequence, a good interface control may be obtained. As such, the exposure time of the conductive layer in the dual damascene structure after the etching process may be efficiently controlled with minimum oxide or contamination generation, thereby increasing manufacturing flexibility and contribution to electrical performance of devices.

Figure 1:
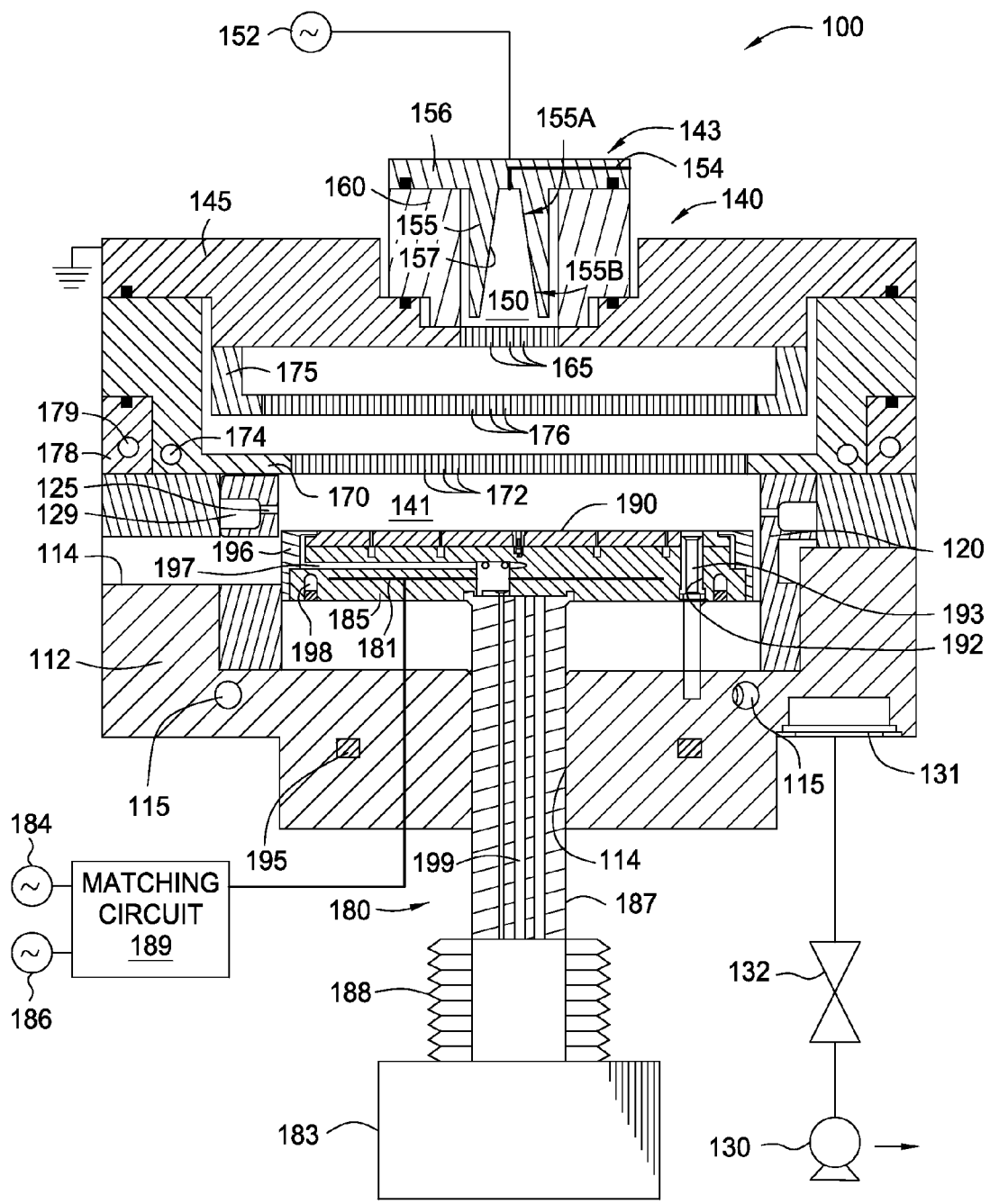
FIG. 1 is a cross section view of an illustrative processing chamber in which embodiments of the invention may be practiced.

FIG. 1 is a cross sectional view of an illustrative processing chamber 100 suitable for conducting an etching process for etching a dielectric barrier layer as further described below. The chamber 100 is configured to remove materials from a substrate surface. One processing chamber 100 suitable for practicing the invention is a Siconi™ processing chamber which is available from Applied Materials, Santa Clara, Calif. It is noted that other vacuum processing chambers available from other manufactures may also be adapted to practice the present invention.

The processing chamber 100 provides both heating and cooling of a substrate surface without breaking vacuum. In one embodiment, the processing chamber 100 includes a chamber body 112, a lid assembly 140, and a support assembly 180. The lid assembly 140 is disposed at an upper end of the chamber body 112, and the support assembly 180 is at least partially disposed within the chamber body 112.

The chamber body 112 includes a slit valve opening 114 formed in a sidewall thereof to provide access to an interior of the processing chamber 100. The slit valve opening 114 is selectively opened and closed to allow access to the interior of the chamber body 112 by a wafer handling robot (not shown).

In one or more embodiments, the chamber body 112 includes a channel 115 formed therein for flowing a heat transfer fluid therethrough. The heat transfer fluid can be a heating fluid or a coolant and is used to control the temperature of the chamber body 112 during processing. Control of the temperature of the chamber body 112 is important to prevent unwanted condensation of the gas or byproducts on the interior of the chamber body 112. Exemplary heat transfer fluids include water, ethylene glycol, or a mixture thereof. An exemplary heat transfer fluid may also include nitrogen gas.

The chamber body 112 can further include a liner 120 that surrounds the support assembly 180. The liner 120 is removable for servicing and cleaning. The liner 120 can be made of a metal such as aluminum, a ceramic material, or any other process compatible material. The liner 120 can be bead blasted to increase surface roughness and/or surface area which increases the adhesion of any material deposited thereon, thereby preventing flaking of material which results in contamination of the processing chamber 100. In one or more embodiments, the liner 120 includes one or more apertures 125 and a pumping channel 129 formed therein that is in fluid communication with a vacuum port 131. The apertures 125 provide a flow path for gases into the pumping channel 129, which provides an egress for the gases within the processing chamber 100 to the vacuum port 131.

A vacuum system is coupled to the vacuum port 131. The vacuum system may include a vacuum pump 130 and a throttle valve 132 to regulate flow of gases through the processing chamber 100. The vacuum pump 130 is coupled to a vacuum port 131 disposed in the chamber body 112 and therefore, in fluid communication with the pumping channel 129 formed within the liner 120. The terms "gas" and "gases" are used interchangeably, unless otherwise noted, and refer to one or more precursors, reactants, catalysts, carrier, purge, cleaning, combinations thereof, as well as any other fluid introduced into the chamber body 112.

The lid assembly 140 includes at least two stacked components configured to form a plasma volume or cavity therebetween. In one or more embodiments, the lid assembly 140 includes a first electrode 143 ("upper electrode") disposed vertically above a second electrode 145 ("lower electrode") confining a plasma volume or cavity 150 therebetween. The first electrode 143 is connected to a power source 152, such as an RF power supply, and the second electrode 145 is connected to ground, forming a capacitance between the two electrodes 143,145.

In one or more embodiments, the lid assembly 140 includes one or more gas inlets 154 (only one is shown) that are at least partially formed within an upper section 156 of the first electrode 143. The one or more process gases enter the lid assembly 140 via the one or more gas inlets 154. The one or more gas inlets 154 are in fluid communication with the plasma cavity 150 at a first end thereof and coupled to one or more upstream gas sources and/or other gas delivery components, such as gas mixers, at a second end thereof.

In one or more embodiments, the first electrode 143 has an expanding section 155 that bounds the plasma cavity 150. In one or more embodiments, the expanding section 155 is an annular member that has an inner surface or diameter 157 that gradually increases from an upper portion 155A to a lower portion 155B thereof. As such, the distance between the first electrode 143 and the second electrode 145 is variable across the expanding section 155. The varying distance helps control the formation and stability of the plasma generated within the plasma cavity 150.

In one or more embodiments, the expanding section 155 resembles an inverted truncated cone or "funnel." In one or more embodiments, the inner surface 157 of the expanding section 155 gradually slopes from the upper portion 155A to the lower portion 155B of the expanding section 155. The slope or angle of the inner diameter 157 can vary depending on process requirements and/or process limitations. The length or height of the expanding section 155 can also vary depending on specific process requirements and/or limitations.

As mentioned above, the expanding section 155 of the first electrode 143 varies the vertical distance between the first electrode 143 and the second electrode 145 because of the gradually increasing inner surface 157 of the first electrode 143. The variable distance is directly influences to the power level within the plasma cavity 150. Not wishing to be bound by theory, the variation in distance between the two electrodes 143, 145 allows the plasma to find the necessary power level to sustain itself within some portion of the plasma cavity 150 if not throughout the entire plasma cavity 150. The plasma within the plasma cavity 150 is therefore less dependent on pressure, allowing the plasma to be generated and sustained within a wider operating window. As such, a more repeatable and reliable plasma can be formed within the lid assembly 140. As the plasma generated in the plasma cavity 150 is defined in the lid assembly 140 prior to entering into a processing region 141 above the support assembly 180 wherein the substrate is proceed, the lid assembly 140 is considered as a remote plasma source because the plasma generated remotely from the processing region 141.

The expanding section 155 is in fluid communication with the gas inlet 154 as described above. The first end of the one or more gas inlets 154 can open into the plasma cavity 150 at the upper most point of the inner diameter of the expanding section 155. Similarly, the first end of the one or more gas inlets 154 can open into the plasma cavity 150 at any height interval along the inner diameter 157 of the expanding section 155. Although not shown, two gas inlets 154 can be disposed at opposite sides of the expanding section 155 to create a swirling flow pattern or "vortex" flow into the expanding section 155 which helps mix the gases within the plasma cavity 150.

The lid assembly 140 can further include an isolator ring 160 that electrically isolates the first electrode 143 from the second electrode 145. The isolator ring 160 can be made from aluminum oxide or any other insulative, process compatible material. The isolator ring 160 surrounds or substantially surrounds at least the expanding section 155.

The lid assembly 140 can further include a distribution plate 170 and blocker plate 175 adjacent the second electrode 145. The second electrode 145, distribution plate 170 and blocker plate 175 can be stacked and disposed on a lid rim 178 which is connected to the chamber body 112. A hinge assembly (not shown) can be used to couple the lid rim 178 to the chamber body 112. The lid rim 178 can include an embedded channel or passage 179 for circulating a heat transfer medium. The heat transfer medium can be used for heating, cooling, or both, depending on the process requirements.

In one or more embodiments, the second electrode or top plate 145 can include a plurality of gas passages or apertures 165 formed beneath the plasma cavity 150 to allow gas from the plasma cavity 150 to flow therethrough. The distribution plate 170 is substantially disc-shaped and also includes a plurality of apertures 172 or passageways to distribute the flow of gases therethrough. The apertures 172 can be sized and positioned about the distribution plate 170 to provide a controlled and even flow distribution to the processing region 141 of the chamber body 112 where the substrate to be processed is located. Furthermore, the apertures 172 prevent the gas(es) from impinging directly on the substrate surface by slowing and re-directing the velocity profile of the flowing gases, as well as evenly distributing the flow of gas to provide an even distribution of gas across the surface of the substrate.

In one or more embodiments, the distribution plate 170 includes one or more embedded channels or passages 174 for housing a heater or heating fluid to provide temperature control of the lid assembly 140. A resistive heating element (not shown) can be inserted within the passage 174 to heat the distribution plate 170. A thermocouple can be connected to the distribution plate 170 to regulate the temperature thereof. The thermocouple can be used in a feedback loop to control electric current applied to the heating element, as described above.

Alternatively, a heat transfer medium can be passed through the passage 174. The one or more passages 174 can contain a cooling medium, if needed, to better control temperature of the distribution plate 170 depending on the process requirements within the chamber body 112. Any heat suitable transfer medium may be used, such as nitrogen, water, ethylene glycol, or mixtures thereof, for example.

In one or more embodiments, the lid assembly 140 can be heated using one or more heat lamps (not shown). Typically, the heat lamps are arranged about an upper surface of the distribution plate 170 to heat the components of the lid assembly 140 including the distribution plate 170 by radiation.

The blocker plate 175 may optionally be disposed between the second electrode 145 and the distribution plate 170. The blocker plate 175 is removably mounted to a lower surface of the second electrode 145. The blocker plate 175 may be in good thermal and electrical contact with the second electrode 145. In one or more embodiments, the blocker plate 175 can be coupled to the second electrode 145 using a bolt or similar fastener. The blocker plate 175 can also be threaded or screwed onto an outer diameter of the second electrode 145.

The blocker plate 175 includes a plurality of apertures 176 to provide a plurality of gas passages from the second electrode 145 to the distribution plate 170. The apertures 176 can be sized and positioned about the blocker plate 175 to provide a controlled and even flow distribution of gases to the distribution plate 170.

The support assembly 180 can include a support member 185 to support a substrate (not shown in FIG. 1) for processing within the chamber body 112. The support member 185 can be coupled to a lift mechanism 183 through a shaft 187 which extends through a centrally-located opening 114 formed in a bottom surface of the chamber body 112. The lift mechanism 183 can be flexibly sealed to the chamber body 112 by a bellows 188 that prevents vacuum leakage from around the shaft 187. The lift mechanism 183 allows the support member 185 to be moved vertically within the chamber body 112 between a process position and a lower transfer position. The transfer position is slightly below the slit valve opening 114 formed in a sidewall of the chamber body 112 so that the substrate may be robotically removed from the substrate support member 185.

In one or more embodiments, the support member 185 has a flat, circular surface or a substantially flat, circular surface for supporting a substrate to be processed thereon. The support member 185 may be constructed of aluminum. The support member 185 can include a removable top plate 190 made of some other material, such as silicon or ceramic material, for example, to reduce backside contamination of the substrate.

In one or more embodiments, the substrate (not shown) may be secured to the support member 185 using a vacuum chuck. In one or more embodiments, the substrate (not shown) may be secured to the support member 185 using an electrostatic chuck. An electrostatic chuck typically includes at least a dielectric material that surrounds an electrode 181, which may be located on the support member 185 or formed as an integral part of the support member 185. The dielectric portion of the chuck electrically insulates the chuck electrode 181 from the substrate and from the remainder of the support assembly 180.

In one embodiment, the electrode 181 is coupled to a plurality of RF power bias sources 184, 186. The RF bias power sources 184, 186 provide RF power to the electrode 181, which excites and sustains a plasma discharge formed from the gases disposed in the processing region 141 of the chamber body 112.

In the embodiment depicted in FIG. 1, the dual RF bias power sources 184, 186 are coupled to the electrode 181 disposed in the support member 185 through a matching circuit 189. The signal generated by the RF bias power sources 184, 186 is delivered through matching circuit 189 to the support member 185 through a single feed to ionize the gas mixture provided in the plasma processing chamber 100, thereby providing ion energy necessary for performing a deposition, etch, or other plasma enhanced process. The RF bias power sources 184, 186 are generally capable of producing an RF signal having a frequency of from about 50 kHz to about 200 MHz and a power between about 0 Watts and about 5000 Watts. Additional bias power sources may be coupled to the electrode 181 to control the characteristics of the plasma as needed.

The support member 185 can include bores 192 formed therethrough to accommodate lift pins 193, one of which is shown in FIG. 1. Each lift pin 193 is constructed of ceramic or ceramic-containing materials, and are used for substrate-handling and transport. The lift pin 193 is moveable within its respective bore 192 when engaging an annular lift ring 195 disposed within the chamber body 112. The lift ring 195 is movable such that the upper surface of the lift pin 193 can be extended above the substrate support surface of the support member 185 when the lift ring 195 is in an upper position. Conversely, the upper surface of the lift pins 193 is located below the substrate support surface of the support member 185 when the lift ring 195 is in a lower position. Thus, each lift pin 193 is moved in its respective bore 192 in the support member 185 when the lift ring 195 moves between the lower position and the upper position.

The support assembly 180 can further include an edge ring 196 disposed about the support member 185. In one or more embodiments, the edge ring 196 is an annular member that is adapted to cover an outer perimeter of the support member 185 and protect the support member 185 from deposition. The edge ring 196 can be positioned on or adjacent the support member 185 to form an annular purge gas channel between the outer diameter of support member 185 and the inner diameter of the edge ring 196. The annular purge gas channel can be in fluid communication with a purge gas conduit 197 formed through the support member 185 and the shaft 187. The purge gas conduit 197 is in fluid communication with a purge gas supply (not shown) to provide a purge gas to the purge gas channel. Any suitable purge gas such as nitrogen, argon, or helium, may be used alone or in combination. In operation, the purge gas flows through the conduit 197, into the purge gas channel, and about an edge of the substrate disposed on the support member 185. Accordingly, the purge gas working in cooperation with the edge ring 196 prevents deposition at the edge and/or backside of the substrate.

The temperature of the support assembly 180 can be controlled by a fluid circulated through a fluid channel 198 embedded in the body of the support member 185. In one or more embodiments, the fluid channel 198 is in fluid communication with a heat transfer conduit 199 disposed through the shaft 187 of the support assembly 180. The fluid channel 198 is positioned about the support member 185 to provide a uniform heat transfer to the substrate receiving surface of the support member 185. The fluid channel 198 and heat transfer conduit 199 can flow heat transfer fluids to either heat or cool the support member 185 and substrate disposed thereon. Any suitable heat transfer fluid may be used, such as water, nitrogen, ethylene glycol, or mixtures thereof. The support member 185 can further include an embedded thermocouple (not shown) for monitoring the temperature of the support surface of the support member 185, which is indicative of the temperature of the substrate disposed thereon. For example, a signal from the thermocouple may be used in a feedback loop to control the temperature or flow rate of the fluid circulated through the fluid channel 198.

The support member 185 can be moved vertically within the chamber body 112 so that a distance between support member 185 and the lid assembly 140 can be controlled. A sensor (not shown) can provide information concerning the position of support member 185 within chamber 100.

In operation, the support member 185 can be elevated to a close proximity of the lid assembly 140 to control the temperature of the substrate being processed. As such, the substrate can be heated via radiation emitted from the distribution plate 170. Alternatively, the substrate can be lifted off the support member 185 to close proximity of the heated lid assembly 140 using the lift pins 193 activated by the lift ring 195.

A system controller (not shown) can be used to regulate the operations of the processing chamber 100. The system controller can operate under the control of a computer program stored on a memory of a computer. The computer program may include instructions that enable the process described below to be performed in the processing chamber 100. For example, the computer program can dictate the process sequencing and timing, mixture of gases, chamber pressures, RF power levels, susceptor positioning, slit valve opening and closing, substrate cooling and other parameters of a particular process.

Figure 2:
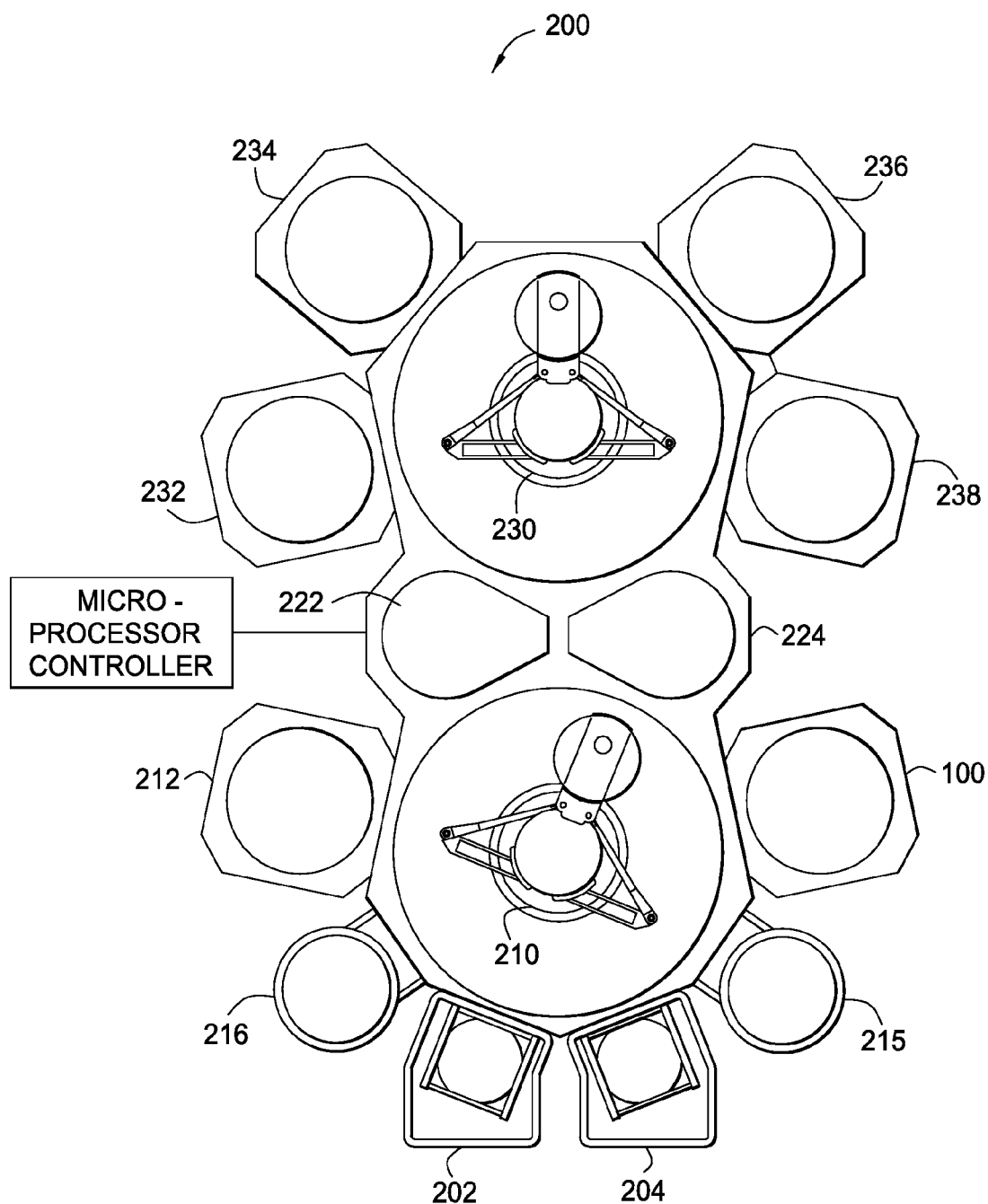
FIG. 2 is a schematic top-view diagram of an illustrative multi-chamber processing system.

FIG. 2 is a schematic top-view diagram of an illustrative multi-chamber processing system 200 that can be adapted to perform processes as disclosed herein having the processing chamber 100 coupled thereto. The system 200 can include one or more load lock chambers 202, 204 for transferring substrates into and out of the system 200. Typically, since the system 200 is under vacuum, the load lock chambers 202, 204 can "pump down" the substrates being introduced into the system 200. A first robot 210 can transfer the substrates between the load lock chambers 202, 204, and a first set of one or more substrate processing chambers 212, 215, 216, 100 (four are shown). Each processing chamber 212, 215, 216, 100 is configured to perform at least one of substrate processing operation, such as an etching process, cyclical layer deposition (CLD), atomic layer deposition (ALD), chemical vapor deposition (CVD), physical vapor deposition (PVD), degas, orientation and other substrate processes. The position of the processing chamber 100 utilized to perform the etching process relative to the other chambers 212, 215, 216 is for illustration, and the position of the processing chamber 100 may be optionally be switched with any one of the processing chambers 212, 215, 216 if desired.

The first robot 210 can also transfer substrates to/from one or more transfer chambers 222, 224. The transfer chambers 222, 224 can be used to maintain ultra-high vacuum conditions while allowing substrates to be transferred within the system 200. A second robot 230 can transfer the substrates between the transfer chambers 222, 224 and a second set of one or more processing chambers 232, 234, 236, 238. Similar to processing chambers 212, 215, 216, 100, the processing chambers 232, 234, 236, 238 can be outfitted to perform a variety of substrate processing operations including the dry etch processes described herein any other suitable process including deposition, pre-clean, degas, and orientation, for example. Any of the substrate processing chambers 212, 215, 216, 100, 232, 234, 236, 238 can be removed from the system 200 if not necessary for a particular process to be performed by the system 200.

Figure 3:
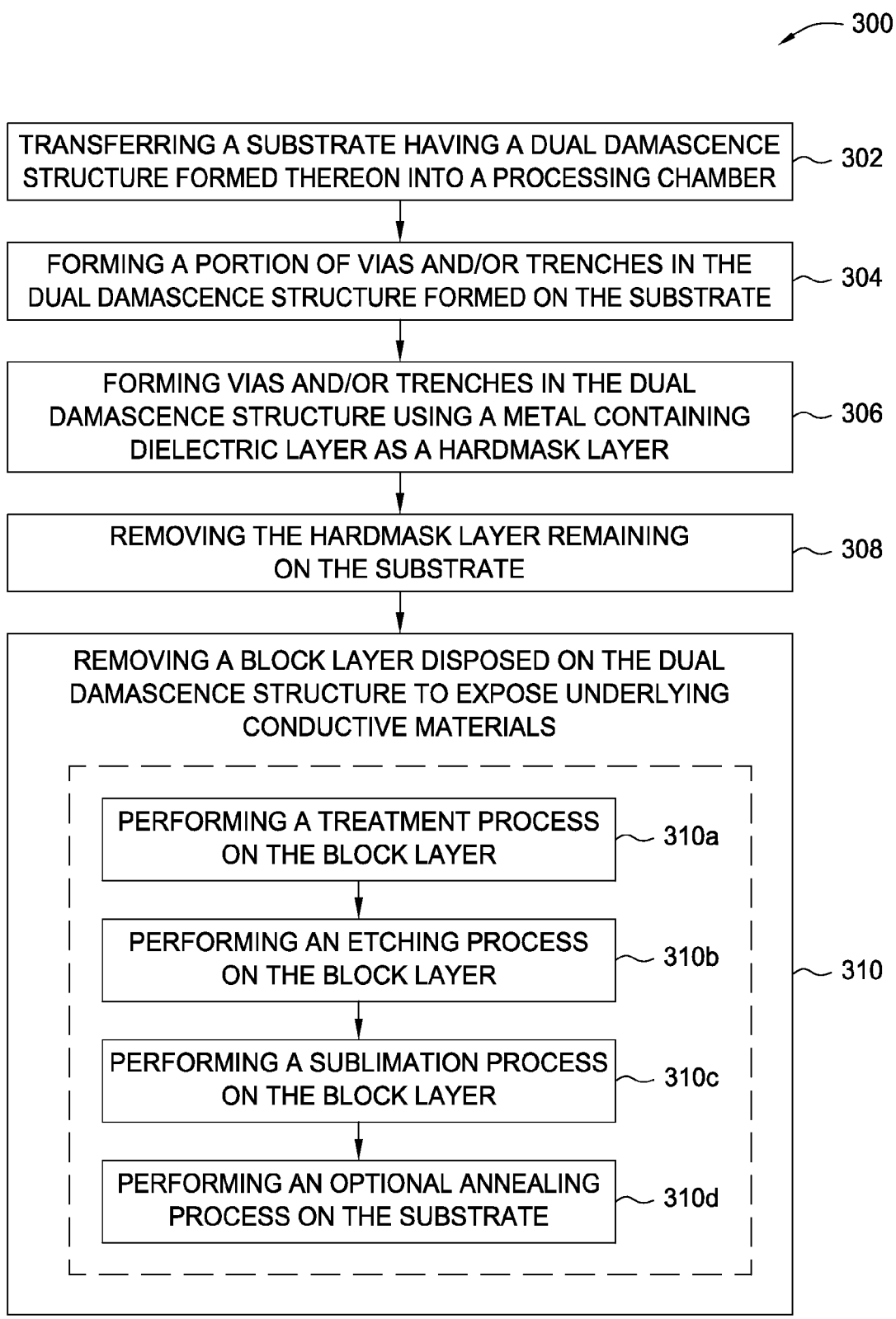
FIG. 3 depicts a flow diagram for forming a dual damascene structure process flow in accordance with one embodiment of the present invention.

FIG. 3 illustrates a process sequence 300 used to manufacture a dual damascene structure using a "Barrier Open Last" process, which may eliminate exposure time of an underlying conductive layer disposed in the dual damascene structure once exposed to the atmosphere after a dielectric barrier is etched opened. The sequence described in FIG. 3 corresponds to the fabrication stages depicted in FIGS. 4A-4E, which illustrates schematic cross-sectional views of a substrate 402 having a film stack 400 formed thereon, which may later be utilized to form a dual damascene structure, during different stages of etching a dielectric barrier layer 408.

Figure 4A:
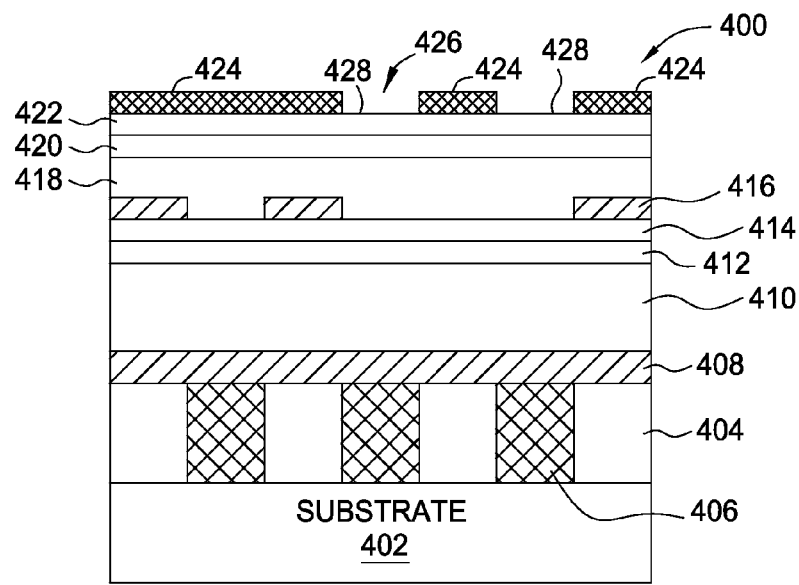
FIGS. 4A-4E depict cross-sectional views of a dielectric barrier layer and a conductive material disposed in a dual damascene structure over a sequence for etching process to form the dual damascene structure in accordance with one embodiment of the present invention.

The process sequence 300 starts at block 302 by transferring a substrate, such as the substrate 402 depicted in FIG. 4A, into the processing chamber, such as the processing chamber 100 depicted in FIG. 1, or other suitable processing chamber. The substrate 402 may have a substantially planar surface, an uneven surface, or a substantially planar surface having a structure formed thereon. The substrate 402 shown in FIG. 4A includes the film stack 400 formed on the substrate 402, which may later be utilized to form a dual damascene structure. In one embodiment, the substrate 402 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 402 may have various dimensions, such as 200 mm, 300 mm or 450 mm diameter wafers, as well as, rectangular or square panels. Unless otherwise noted, embodiments and examples described herein are conducted on substrates with a 300 mm diameter or a 450 mm diameter.

In one embodiment, the film stack 400 has multiple film layers that may be utilized to form an interconnection structure, such as a dual damascene structure, utilized in the back end semiconductor process. The film stack 400 includes a dielectric barrier layer 408 disposed on the substrate 402 above an insulating stack 404. The insulating stack 404, as shown in FIG. 4A, is disposed on the substrate 402 having conductive layer 406, such as copper line, formed in and bounded by the insulating stack 404. The dielectric barrier layer 408 is disposed on the insulating stack 404 preventing the underlying conductive materials of the conductive layer 406 from being exposed to the atmosphere.

A dielectric bulk insulating layer 410 is disposed on the dielectric barrier layer 408 having a hardmask layer 416 disposed on an optionally multiple capping layer, such as a first capping layer 414 on a second capping layer 412. A spin-on organic planarization layer 418 along with an optional dual layer anti-reflective coating (ARC) layer 422, 420 may be disposed on the hardmask layer 416 to increase lithography development accuracy. A patterned photoresist layer 424 is then disposed on a top surface of the optional dual layer anti-reflective coating (ARC) layer 422, 420 having openings 426 formed therein to expose a portion 428 of the optional dual layer anti-reflective coating (ARC) layer 422, 420 for etching. The etching process may form vias and/or trenches in the dielectric bulk insulating layer 410 as needed.

In one embodiment, the patterned photoresist layer 424 may be a photoresist material, such as a positive tone photoresist, a negative tone photoresist, a UV lithography photoresist, an I-line photoresist, an G-line photoresist, an e-beam resist (for example, a chemically amplified resist (CAR)) or other suitable photoresist. The optional dual layer anti-reflective coating (ARC) layer 422, 420 may include an upper anti-reflective coating (ARC) layer 422 disposed on a silicon oxide layer 420. Suitable examples of the upper anti-reflective coating (ARC) layer 422 include an amorphous carbon layer, a doped amorphous carbon layer, a silicon oxide layer, a silicon nitride layer, a silicon oxynitride layer, or a layer formed from other suitable materials.

The spin-on organic planarization layer 418 disposed on the hardmask layer 416 may be an organic polymer material spin-on-coated onto the hardmask layer 416. The spin-on organic planarization layer 418 may be spin-on-coated onto a non-planar substrate surface (i.e., the upper surface of the hardmask layer 416) with a sufficient thickness to create a substantially planar top surface for the spin-on organic planarization layer 418. In one embodiment, the organic polymer material suitable for forming the spin-on organic planarization layer 418 includes a hydrocarbon containing material. Suitable examples of the hydrocarbon material include photoresist materials, spin-on-glass (SOG) materials, and the like. In one example, the photoresist material may be a positive tone photoresist, a negative tone photoresist, a UV lithography photoresist, an I-line photoresist, an G-line photoresist, an e-beam resist (for example, a chemically amplified resist (CAR)) or other suitable photoresist.

In one embodiment, the planarization layer 418 may be coated onto the hardmask layer 416 with a thickness between about 20 nm and about 800 nm, for example between about 100 nm and about 400 nm. It is believed that the organic polymer materials provided for the planarization layer 418 may have a self-leveling planarization property so as to be coated onto the hardmask layer 416 to evenly cover the uneven topography of the structures formed on the substrate 402. By doing so, uneven topographic surface from the substrate 402 may be covered with a planarized or flattened top surface to facilitate the subsequent photolithographic process so as to transfer features into the structures on the substrate 402 with accurate and precise dimension control.

In one embodiment, the planarization layer 418 may be spin-coated onto the substrate surface. In another embodiment, the planarization layer 418 may also be coated onto the substrate 402 using injection, spray deposition system, spray deposition system, aerosol deposition (AD) process, aerojet, nanoparticles spray from solution, spray CVD, ink-jet, meniscus coating, dip coating, electroplating, spray coating, electrospraying, screen printing, or by other suitable technique as needed.

Underneath the planarization layer 418, the hardmask layer 416 formed on the substrate 402 may serve as a mask layer during the subsequent etching/patterning process so as to efficiently transfer features into the film stack 400. In one embodiment, the hardmask layer 416 as utilized here may be a metal dielectric layer, such as TiN, TaN, TiON, TaON, $Al_2O_3$, AlON, AlN or the like. In one particular embodiment, the hardmask layer 416 is a TiN layer or a TaN layer. The hardmask layer 416 may be formed by a chemical vapor deposition (CVD), atomic layer deposition (ALD), cyclical layer deposition (CLD), physical vapor deposition (PVD), or the like as needed.

The optional multiple capping layer includes the first capping layer 414 on the second capping layer 412. The first capping layer 414 may be a TEOS layer, a silicon oxide layer or an amorphous carbon layer and the second capping layer 412 may be a low-k capping layer formed from a carbon-containing silicon oxide (SiOC), similar to a BLACK DIAMOND® dielectric material available from Applied Materials, Inc.

The dielectric bulk insulating layer 410 and the insulating stack 404 are dielectric materials having a dielectric constant less than 4.0 (e.g., a low-k material). Examples of suitable materials include carbon-containing silicon oxides (SiOC), such as BLACK DIAMOND® dielectric material and other low-k polymers, such as polyamides. The dielectric barrier layer 408 has a dielectric constant of about 5.5 or less. In one embodiment, the dielectric barrier layer 408 is a carbon containing silicon layer (SiC), a nitrogen doped carbon containing silicon layer (SiCN), a silicon nitride layer, a metal nitride or metal oxide, such as AlN or AlON, composite layers with multiple materials, combinations thereof, or the like. In the embodiment depicted in FIG. 4A, the dielectric barrier layer is a SiCN film or a SiN film. An example of the dielectric barrier layer material is BLOK® dielectric material, available from Applied Materials, Inc. Another example of the dielectric barrier layer 408 may also be a PVD AlN and/or AlON, also available from Applied Materials, Inc. Yet another example of the dielectric barrier layer 408 may also be an integrated bi-layer or multiple layer from the materials listed above including the BLOK® dielectric material and the PVD AlN and/or AlON, available from Applied Materials, Inc The conductive layer 406, such as copper materials, is present in the insulating stack 404.

Figure 4B:
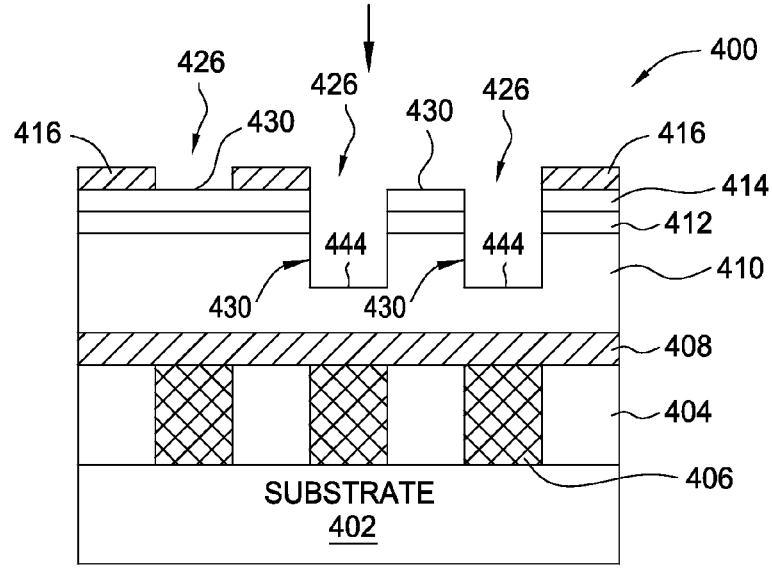

At block 304, a patterning process is performed to etch the dielectric bulk insulating layer 410, as shown in FIG. 4B using the patterned photoresist layer 424 as an etching mask. In the embodiment depicted in FIG. 4B, the dielectric stack 400 is etched/patterned through the opening 426 defined in the patterned photoresist layer 424 so as to define a portion of trenches 430 in the dielectric bulk insulating layer 410. A portion of the dielectric bulk insulating layer 410 is removed to expose a tentative bottom surface 444 of the dielectric bulk insulating layer 410. In one embodiment, the dielectric bulk insulating layer 410 is etched using a plasma formed from fluorine and carbon. The dielectric bulk insulating layer 410 may be etched in the processing chamber 100 or other suitable reactors.

During the etching/patterning process of the dielectric bulk insulating layer 410, the photoresist layer 424 along with the underlying optional dual layer anti-reflective coating (ARC) layer 422, 420 may be consumed or etched away when the dielectric bulk insulating layer 410 reaches a predetermined depth in the dielectric bulk insulating layer 410. Alternatively, the remaining photoresist layer 424 along with the underlying optional dual layer anti-reflective coating (ARC) layer 422, 420 may be removed or washed away in another separate process step after the dielectric bulk insulating layer 410 reached to a predetermined depth exposing the tentative bottom surface 444, as shown in FIG. 4B.

Figure 4C:
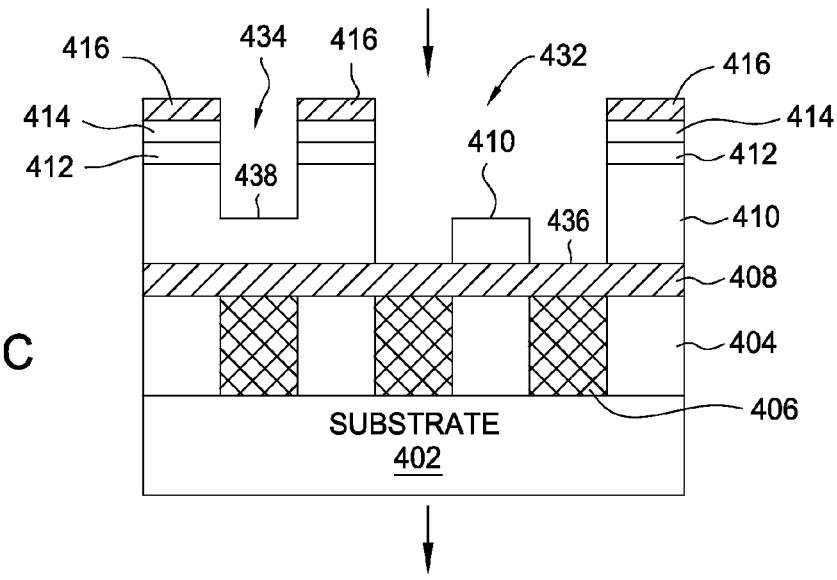

At block 306, a dielectric bulk insulating layer etching process is performed to further etch the dielectric bulk insulating layer 410 using the hardmask layer 416 as an etching mask, as shown in FIG. 4C. The portion of the trench 430 defined at block 304 with reference to FIG. 4B is now further etched through the tentative bottom surface 444 until an underlying surface 434 436 of the dielectric barrier layer 408 is exposed, defining the desired trench 432 along with vias 434 formed in the dielectric bulk insulating layer 410. A portion of the dielectric bulk insulating layer 410 remains on the substrate 402 defining a bottom surface 438 of the vias 434 on the substrate 402. In one embodiment, the dielectric bulk insulating layer 410 is etched using a plasma formed from fluorine and carbon. Alternatively, the dielectric bulk insulating layer 410 may be etched in the processing chamber 100 or other suitable reactors.

Figure 4D:
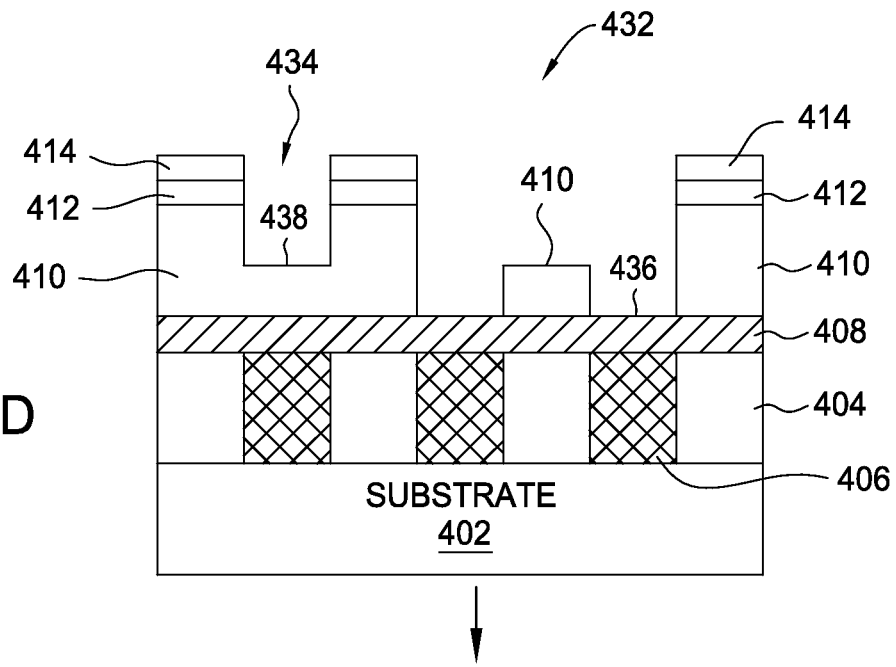

At block 308, after the vias 434 and the trenches 432 are formed in the dielectric bulk insulating layer 410 exposing the surface 436 of the dielectric barrier layer 408, the hardmask layer 416 remaining on the substrate 402 may be then removed from the substrate 402, as shown in FIG. 4D, prior to etching of the dielectric barrier layer 408. Unlike the conventional practices in which the hardmask layer removal process is performed after the etching process of the dielectric barrier layer 408, the early exposure of the underlying conductive layer 406 often results in contamination adhered on the interface of the conductive layer 406, thereby adversely deteriorating the device electrical performance. By performing a "Barrier Open Last" process by switching the order of the hardmask layer removal process and the dielectric barrier etching process (or called barrier open last process), the film property of the underlying conductive layer 406 may be preserved, thereby eliminating the exposure time of the underlying conductive layer 406 to the adjacent atmosphere and efficiently reducing likelihood of contamination to the conductive layer 406.

In one embodiment, the hardmask removal process may be performed by soaking, dipping, flooding or immersing the substrate 402 into a solution comprising peroxide in organic solvent. In another embodiment, the hardmask removal process may be performed by a dry etching process utilizing chlorine containing gas as a source of etchants.

Figure 4E:
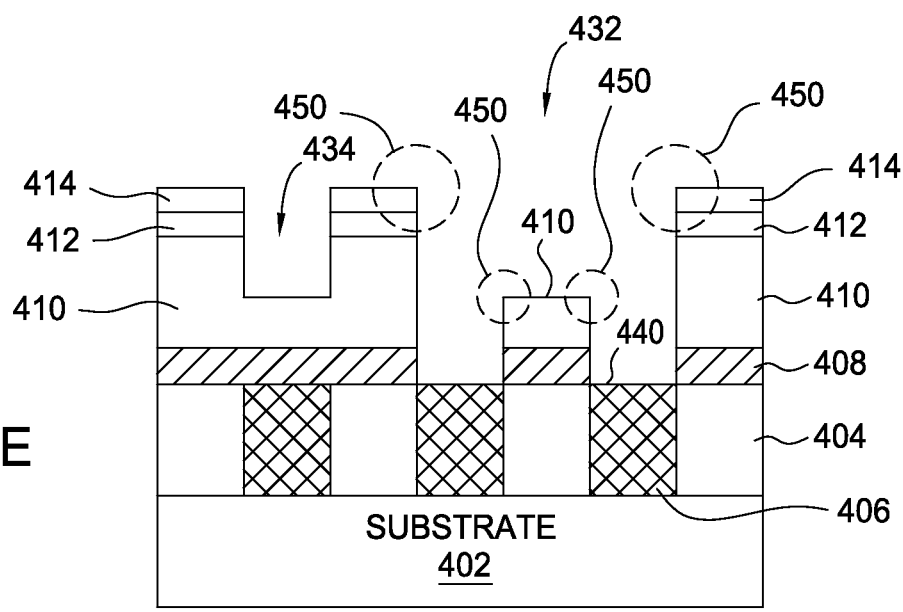

At block 310, after the hardmask layer 416 is removed from the substrate 402, a dielectric barrier layer etching process (or called "Barrier Open Process") is then performed to etch the dielectric barrier layer 408 from the surface 436 exposed by the trenches 432 defined in the dielectric bulk insulating layer 410, as shown in FIG. 4E. The dielectric barrier layer etching process may include multiple steps to incrementally and gradually etch the dielectric barrier layer 408 without damaging the underlying conductive layer 406. In one embodiment, the dielectric barrier layer etching process (or called "Barrier Open Process") includes at least three steps (or more) to incrementally etch the dielectric barrier layer 408.

In a first sub-step 310a during the dielectric barrier layer etching process at block 310, a treatment process is performed to treat the exposed surface 436 of the dielectric barrier layer 408 (as shown in FIG. 4D) to alter the surface properties to facilitate removal of the dielectric barrier layer 408 in the subsequent etching process described in a second sub-step 310b. The treatment process performed at first sub-step 310a includes supplying a treatment gas mixture into a processing chamber, such as the chamber 100 depicted in FIG. 1. A plasma is then formed from the treatment gas mixture to plasma treat the surfaces 436 of the dielectric barrier layer 408 exposed by the trenches 432 of the dielectric bulk insulating layer 410. The treatment process activates the dielectric barrier layer 408 into an excited state, forming a treated dielectric barrier layer 408 in the area unprotected by the dielectric bulk insulating layer 410. The dielectric barrier layer 408 after treatment may then easily react with etching gases subsequently supplied into the processing chamber 100 at the second sub-step 310b, forming volatile gas byproducts which readily pump out of the processing chamber 100.

In one embodiment, the treatment gas mixture includes at least one of a hydrogen containing gas, a nitrogen containing gas, or an inert gas. It is believed that the hydrogen containing gas, the nitrogen containing gas, or inert gas supplied in the treatment gas mixture may assist increasing the lifetime of the ions in the plasma formed from the treatment gas mixture. Increased lifetime of the ions may assist reacting with and activating the dielectric barrier layer 408 on the substrate 400 more thoroughly, thereby enhancing the removal of the activated dielectric barrier layer 408 from the substrate 400 during the subsequent etching process. In the embodiment wherein the hydrogen containing gas is utilized in the treatment gas mixture, the hydrogen atoms from the hydrogen containing gas may react with the silicon atoms contained in the dielectric barrier layer 408, thereby forming weak and dangling bond of Si—H or Si—OH bond on the dielectric barrier layer 408. The dielectric barrier layer 408 after treatment with Si—H or Si—OH bond terminals may easily to be absorbed by other etchants subsequently supplied to the processing chamber 100, thereby assisting ease of removal of the dielectric barrier layer 408 from the substrate surface.

In one embodiment, the hydrogen containing gas supplied into the processing chamber 100 includes at least one of $H_2$, $H_2O$, $NH_3$ and the like. The nitrogen containing gas supplied into the processing chamber 100 includes at $N_2$, $N_2O$, $NO_2$, $NH_3$ and the like The inert gas supplied into the processing chamber 100 includes at least one of Ar, He, Kr, and the like. In an exemplary embodiment, the hydrogen containing gas supplied in the processing chamber 100 to perform the treatment process is $H_2$ gas, and the nitrogen containing gas supplied in the processing chamber 100 to perform the treatment process is $NH_3$ or $N_2$ gas and the inert gas is He or Ar.

During the plasma treatment process, several process parameters may be regulated to control the treatment process. In one exemplary embodiment, a process pressure in the processing chamber 100 is regulated between about 10 mTorr to about 5000 mTorr, such as between about 10 mTorr and about 400 mTorr, for example about 200 mTorr. A RF bias power at a frequency of about 13 MHz may be applied to maintain a plasma in the treatment gas mixture. For example, a RF bias power of about less than 100 Watts, such as about 5 Watts to about 50 Watts may be applied to maintain a plasma inside the processing chamber 100. The treatment gas mixture may be flowed into the chamber at a rate between about 100 sccm to about 800 sccm. A substrate temperature is maintained between about 25 degrees Celsius to about 300 degrees Celsius, such as between about 50 degrees Celsius and about 140 degrees Celsius, for example between about 50 degrees Celsius and about 130 degrees Celsius, such as about 110 degrees Celsius.

In one embodiment, the substrate 400 is subjected to the treatment process for between about 5 seconds to about 5 minutes, depending on the operating temperature, pressure and flow rate of the gas. For example, the substrate can be exposed to the pretreatment processes for about 30 seconds to about 90 seconds. In an exemplary embodiment, the substrate is exposed to the treatment process for about 90 seconds or less.

At the second sub-step 310b, a remote plasma etching process is performed on the substrate 402 to etch the dielectric barrier layer 408 after the treatment process is performed on the substrate 402. The remote plasma etching process is a gentle etching process performed to slowly remove the dielectric barrier layer 408 exposed by the dielectric bulk insulating layer 410 on the substrate 400. The remote plasma etching process is performed by supplying an etching gas mixture into the plasma cavity 150 into the processing chamber 100 to form a remote plasma in the plasma cavity 150 from the processing gas mixture prior to flow the processing gas for etching the dielectric barrier layer 408 after the treatment process.

In one embodiment, the etching gas mixture used to remove the dielectric barrier layer 408 is a mixture of ammonia ($NH_3$) gas and nitrogen trifluoride ($NF_3$) gas. The ammonia ($NH_3$) gas used in the etching gas mixture may be replaced with $N_2$ gas as needed. The amount of each gas introduced into the processing chamber may be varied and adjusted to accommodate, for example, the thickness of the dielectric barrier layer 408 to be removed, the geometry of the substrate being processed, the volume capacity of the plasma cavity, the volume capacity of the chamber body, as well as the capabilities of the vacuum system coupled to the chamber body.

As the plasma is generated remotely in the plasma cavity 150, the etchants dissociated from the etching gas mixture from the remote plasma is relatively mild and gentle, so as to slowly, gently and gradually chemically react the dielectric barrier layer 408 until the underlying conductive layer 406 is exposed, as shown in FIG. 4E. It is believed that in the remote plasma source, ammonia ($NH_3$) gas and the nitrogen trifluoride ($NF_3$) gas are dissociated in the remote plasma cavity 150, forming ammonium fluoride ($NH_4F$) and/or ammonium fluoride with HF ($NH_4F.HF$). Once the etchants of ammonium fluoride ($NH_4F$) and ammonium fluoride with HF ($NH_4F.HF$) are introduced into the processing region 141 of the processing chamber 100, the etchants of ammonium fluoride ($NH_4F$) and ammonium fluoride with HF ($NH_4F.HF$) may react with the dielectric materials of the dielectric barrier layer 408 upon reaching the substrate, forming $(NH_4)_2SiF_6$, mostly in a solid state. The etchants of ammonium fluoride (NH$_4$F) and ammonium fluoride with HF (NH$_4$F.HF) chemically react the dielectric barrier layer 408, forming (NH$_4$)$_2$SiF$_6$ in solid state, which will be later removed from the substrate surface by using a low temperature sublimation process, which will be discussed in further detail at a third sub-step at block 310c.

In one or more embodiments, the gases added to provide the etching gas mixture having at least a 1:1 molar ratio of ammonia (NH$_3$) to nitrogen trifluoride (NF$_3$). In one or more embodiments, the molar ratio of the etching gas mixture is at least about 3:1 (ammonia to nitrogen trifluoride). The gases are introduced in the chamber 100 at a molar ratio of about 5:1 (ammonia to nitrogen trifluoride) to about 20:1. In yet another embodiment, the molar ratio of the etching gas mixture is about 5:1 (ammonia to nitrogen trifluoride) to about 10:1.

In one embodiment, other types of gas, such as inert gas or carrier gas, may also be supplied in the etching gas mixture to assist carrying the etching gas mixture into the processing region 141 of the vacuum processing chamber 100. Suitable examples of the inert gas or carrier gas include at least one of Ar, He, N$_2$, O$_2$, N$_2$O, NO$_2$, NO, and the like. In one embodiment, the inert or carrier gas may be supplied into the vacuum processing chamber 100 is Ar or He at a volumetric flow rate of between about 200 sccm and about 1500 sccm.

While supplying the etching gas mixture to perform the remote plasma source etching process, a substrate temperature may be maintained at a range of between about 40 degrees Celsius and about 150 degrees Celsius, such as about 110 degrees Celsius. After the etching gas mixture is supplied into the processing chamber, the dielectric barrier layer 408 may be then etched, forming solid etching byproduct, such as ammonium fluorosilicate (NH$_4$)$_2$SiF$_6$, on the substrate surface. The etching byproduct, (NH$_4$)$_2$SiF$_6$, remaining on the substrate 402 has a relatively low melting point, such as about 100 degrees Celsius, which allows the byproduct, (NH$_4$)$_2$SiF$_6$, to be removed from the substrate by a sublimation process performed at the third sub-step 310c, which will be further discussed below. The etching process may be continuously performed until the dielectric barrier layer 408 disposed on the substrate 400 has all been reacted and converted to the etching byproduct.

During the etching process, several process parameters may be regulated to control the etching process. In one exemplary embodiment, a process pressure in the processing chamber 100 is regulated to between about 10 mTorr to about 5000 mTorr, such as between about 800 mTorr and about 5000 mTorr, for example between about 100 mTorr and about 1000 mTorr. A RF source power at a frequency of about 80 KHz may be applied to maintain a plasma in the etching gas mixture. For example, a RF source power of about 20 Watts to about 800 Watts, such as about 300 Watts and about 800 Watts, for example about 600 Watts, may be applied to the etching gas mixture. The RF source power as referred herein may be the RF power supplied from the power source 152 to the electrodes 143, 145. In one embodiment, the RF source power may provide power at a frequency of about 80 KHz.

At the third sub-step 310c, after the etching process is completed and the dielectric barrier layer 408 has substantially reacted and converted to the etching byproduct, a sublimation process is performed to sublimate the etching byproduct into a volatile state which can be pumped out of the processing chamber 100. The sublimation process removes the etching byproduct from the substrate 402, exposing the underlying conductive layer 406, as shown in FIG. 4E. The sublimation process may be performed in the same chamber where the remote plasma etching process at second sub-step 310b is performed, such as the processing chamber 100 as described above. Alternatively, the sublimation process may be performed at a separate processing chamber of the system 200 as needed.

The sublimation process may be a plasma anneal process utilizing a plasma energy to sublimate the etching byproduct from the substrate 402. The thermal energy from the plasma may efficiently remove the etching byproduct, by the nature of the low melting (sublimation) point to the etching byproduct, such as ammonium fluorosilicate (NH$_4$)$_2$SiF$_6$.

In one embodiment, the sublimation process may utilize a low RF bias power plasma treatment process to gently and mildly treat the substrate without damaging to the substrate surface. In one embodiment, the low temperature plasma process may use a low RF bias power, such as less than about 30 Watts, along with controlling the substrate temperature controlled between about 20 degrees Celsius and about 150 degrees Celsius, such as about 110 degrees Celsius, to sublimate the etching byproducts from the substrate surface.

The sublimation process is performed by supplying a sublimation gas mixture into the chamber 100. A plasma is then formed from the plasma in the sublimation gas mixture to plasma anneal the substrate 400, forming volatile gas byproducts which readily pumps out of the processing chamber 100.

In one embodiment, the sublimation gas mixture includes at least one of a hydrogen containing gas, a nitrogen containing gas, or an inert gas. It is believed that the hydrogen containing gas, the nitrogen containing gas, or inert gas supplied in the plasma anneal gas mixture may assist increasing the lifetime of the ions in the plasma formed from the sublimation gas mixture, thereby efficiently removing the etching byproducts from the substrate 400. Increased lifetime of the ions may assist reacting with and activating the etching byproduct on the substrate 402 more thoroughly, thereby enhancing the removal of the etching byproduct from the substrate 402.

In one embodiment wherein the hydrogen containing gas is selected to be supplied in the sublimation gas mixture, the hydrogen containing gas supplied into the processing chamber 100 includes at least one of H$_2$, H$_2$O, and the like. In one embodiment wherein the nitrogen containing gas is selected to be supplied in the sublimation gas mixture, the nitrogen containing gas supplied into the processing chamber 100 includes at least one of N$_2$, N$_2$O, NO$_2$, NH$_3$ and the like. In one embodiment wherein the inert gas is selected to be supplied in the sublimation gas mixture, the inert gas supplied into the processing chamber 100 includes at least one of Ar, He, Kr, and the like. In an exemplary embodiment, the hydrogen containing gas supplied in the processing chamber 100 to perform the sublimation process is H$_2$ gas, and the nitrogen containing gas supplied in the processing chamber 100 to perform the sublimation process is N$_2$ gas and the inert gas is He or Ar.

During the sublimation process, several process parameters may be regulated to control the sublimation process. A RF bias power at a frequency of about 13 MHz may be applied to maintain a plasma in the treatment gas mixture. For example, a RF bias power of less than 30 Watts may be applied to maintain a plasma inside the processing chamber 100. The sublimation process mixture may be flowed into the chamber at a rate of between about 100 sccm to about 2000 sccm, such as about 1000 sccm. A substrate temperature is maintained between about 20 degrees Celsius and about 150 degrees Celsius, such as about 110 degrees Celsius. In some embodiment, no power is applied to the electrodes 143, 145.

After the sublimation process, an optional anneal process at fourth sub-step 310d may be selectively performed. In the embodiment that the sublimation process at third sub-step 310c cannot efficiently remove most of the etching byproduct, an optional anneal process may be performed to assist evaporating the remaining etching byproduct from the substrate 402. The anneal process at fourth sub-step 310d may be a thermal annealing process utilizing a thermal energy to further evaporate etching byproduct from the substrate 402. The thermal energy may efficiently remove the etching byproduct from the substrate 402. In one embodiment, the optional anneal process may utilize a low RF bias power plasma anneal process or a thermal treatment process to gently and mildly treat the substrate without damaging to the substrate surface. In one embodiment, the low RF bias power plasma anneal process may use a low RF bias power, such as less than about 50 Watts, along with controlling the substrate temperature to between about 100 degrees Celsius and about 400 degrees Celsius, such as between about 150 degrees Celsius and about 300 degrees Celsius. It is noted that the optional anneal process at fourth sub-step 310d may be any suitable thermal annealing process, including furnace annealing, thermal annealing, baking, or any suitable heating process.

In one embodiment, the anneal gas mixture includes at least one of a hydrogen containing gas, a nitrogen containing gas, or an inert gas. It is believed that the hydrogen containing gas, the nitrogen containing gas, or inert gas supplied in the anneal gas mixture may assist increasing the lifetime of the ions in the plasma formed from the anneal gas mixture, thereby efficiently removing the etching byproducts from the substrate 402. In one embodiment, an inert gas, such as Ar, He, Kr, and the like, may be supplied in the annealing gas mixture to perform the annealing process.

It is noted that sub-steps of the first, second, third and fourth sub-steps, 310a, 310b, 310c, 310d, may be repeatedly (i.e., cyclically) performed, until the dielectric barrier layer 408 is removed to expose the underlying conductive layer 406, as shown in FIG. 4E. In the embodiment wherein the optional annealing process at the fourth sub-step 310d is not performed, the sub-steps of the first, second and third sub-steps, 310a, 310b, 310c may then be repeatedly performed without the fourth sub-step 310d. The repeated processes may cyclically and incrementally etch the dielectric barrier layer 408 without over aggressively attacking the underlying conductive layer 406, thereby providing a good interface etching control and a proper etch stop endpoint. Incremental etching with repetitive treatment, etching process, sublimation process, and/or the optional annealing process improves feature verticality and promotes etching selectivity among the dielectric barrier layer 408 without damaging corners, as indicated in circles 450 at FIG. 4E, of the dielectric bulk insulating layer 410, thereby enhancing accuracy of mask to transfer feature critical dimensions (CD) to the dielectric barrier layer 408.

Thus, methods and an apparatus for forming a dual damascene structure without early exposure to an underlying conductive layer and for etching a dielectric barrier layer in the dual damascene structure are provided. By utilizing a "Barrier Open Last" process (i.e., performing a hardmask layer removal process prior to a dielectric barrier layer open process) along with a repetitive and incremental etching process of the dielectric barrier layer, elimination of the exposure time of the underlying conductive layers after the dielectric barrier layer etching process may be obtained, thereby efficiently controlling oxide or contamination generation on the underlying conductive layers, and thus increasing manufacturing flexibility and electrical performance of the devices without degradation of device performance.

While the foregoing is directed to embodiments of the present invention, other and further embodiments of the invention can be devised without departing from the basic scope thereof, and the scope thereof is determined by the claims that follow.

The invention claimed is:

1. A method for etching a dielectric barrier layer disposed on a substrate, comprising:
    patterning a substrate having a dielectric bulk insulating layer disposed on a dielectric barrier layer using a hardmask layer disposed on the dielectric bulk insulating layer as an etching mask;
    exposing a portion of the dielectric barrier layer after removing the dielectric bulk insulating layer uncovered by the dielectric bulk insulating layer;
    removing the hardmask layer from the substrate; and
    subsequently etching the dielectric barrier layer exposed by the dielectric bulk insulating layer, wherein subsequently etching the dielectric barrier layer further comprises:
    performing a treatment process on the dielectric barrier layer;
    performing a remote plasma process in an etching gas mixture supplied into the etching processing chamber to etch the treated dielectric barrier layer disposed on the substrate; and
    performing a plasma annealing process to anneal the dielectric barrier layer to remove the dielectric barrier layer from the substrate.

2. The method of claim 1, wherein removing the hardmask layer further comprises:
    immersing the substrate in a solution comprising peroxide in organic solvent.

3. The method of claim 1, wherein the hardmask layer is at least one of TiN, TaN, TiON, TaON, $Al_2O_3$, AlON or AlN.

4. The method of claim 1, wherein performing the remote plasma process in the etching gas mixture further comprises:
    supplying an ammonium gas and a nitrogen trifluoride in the etching gas mixture in a molar ratio of about 5:1 to about 20:1.

5. The method of claim 1, wherein performing the remote plasma process in the etching gas mixture further comprises:
    maintaining a substrate temperature between about 40 degrees Celsius and about 150 degrees Celsius.

6. The method of claim 1, wherein performing the plasma annealing process further comprises:
    sublimating an etching byproduct from the substrate.

7. The method of claim 1, wherein the dielectric barrier layer is a silicon carbide layer or a silicon nitride layer.

8. The method of claim 1, wherein performing the remote plasma process in the etching gas mixture further comprises:
    applying a RF source power to remotely generate the plasma from the etching gas mixture.

9. The method of claim 1, further comprising:
    repetitively performing the treatment process, remote plasma process and the plasma annealing process until the dielectric barrier layer is removed from the substrate.

10. The method of claim 1, further comprising:
    performing an additional annealing process after the plasma annealing process.

11. The method of claim 10, wherein the additional annealing process further comprising:
    supplying a RF bias power at a frequency about 13 MHz.

12. The method of claim 1, wherein the plasma annealing the dielectric barrier layer to remove the dielectric barrier layer on the substrate further comprises:

exposing a conductive layer disposed in the substrate after the dielectric barrier layer is removed.

13. The method of claim 10, wherein the additional annealing process further comprises:
maintaining a substrate temperature between about 150 degrees Celsius and about 400 degrees Celsius.

14. A method for etching a dielectric barrier layer disposed on a substrate, comprising:
patterning a substrate having a dielectric bulk insulating layer disposed on a dielectric barrier layer using a hardmask layer disposed on the dielectric bulk insulating layer as an etching mask;
exposing a portion of the dielectric barrier layer after removing the dielectric bulk insulating layer uncovered by the dielectric bulk insulating layer;
removing the hardmask layer from the substrate;
subsequently etching the dielectric barrier layer exposed by the dielectric bulk insulating layer by generating a plasma in an etching gas mixture to etch the dielectric barrier layer disposed on the substrate, wherein the etching gas mixture includes an ammonium gas and a nitrogen trifluoride; and
plasma annealing the substrate to remove the dielectric barrier layer from the substrate.

15. The method of claim 14, wherein etching the dielectric barrier layer further comprises:
treating the dielectric barrier layer prior to supplying the etching gas mixture into the processing chamber.

16. The method of claim 14, wherein subsequently etching the dielectric barrier layer exposed by the dielectric bulk insulating layer by generating the plasma in the etching gas mixture further comprises:
generating the plasma in the etching gas mixture remotely from an etching processing chamber, wherein the plasma is remotely generated by applying a RF source power in the etching gas mixture having a frequency of about 80 KHz.

17. The method of claim 14, wherein the dielectric barrier layer is a silicon carbide layer or a silicon nitride layer.

18. The method of claim 14, wherein the hardmask layer is at least one of TiN, TaN, TiON, TaON, $Al_2O_3$, AlON, or AlN.

* * * * *